United States Patent
Kim et al.

(10) Patent No.: US 9,147,719 B2
(45) Date of Patent: Sep. 29, 2015

(54) THIN FILM TRANSISTOR ARRAY SUBSTRATE, ORGANIC LIGHT-EMITTING DISPLAY APPARATUS AND METHOD OF MANUFACTURING THE THIN FILM TRANSISTOR ARRAY SUBSTRATE

(71) Applicant: SAMSUNG DISPLAY CO., LTD., Yongin, Gyeonggi-Do (KR)

(72) Inventors: Jung-Bae Kim, Yongin (KR); Dong-Kyu Kim, Yongin (KR); Bo-Yong Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/231,263

(22) Filed: Mar. 31, 2014

(65) Prior Publication Data

US 2015/0123084 A1 May 7, 2015

(30) Foreign Application Priority Data

Nov. 5, 2013 (KR) .......................... 10-2013-0133831

(51) Int. Cl.
*H01L 35/24* (2006.01)
*H01L 27/32* (2006.01)

(52) U.S. Cl.
CPC .......... *H01L 27/326* (2013.01); *H01L 27/3276* (2013.01)

(58) Field of Classification Search
CPC ............ H01L 51/0541; H01L 51/0545; H01L 51/0036; H01L 51/5012
USPC .................. 257/40, 59, 72, E51.001
See application file for complete search history.

(56) References Cited

U.S. PATENT DOCUMENTS

| | | | |
|---|---|---|---|
| 2009/0206332 | A1 | 8/2009 | Son et al. |
| 2010/0176392 | A1 | 7/2010 | Kang et al. |
| 2011/0049523 | A1 | 3/2011 | Choi et al. |
| 2011/0079784 | A1 | 4/2011 | Im |

FOREIGN PATENT DOCUMENTS

| | | |
|---|---|---|
| KR | 10-2009-0084642 A | 8/2009 |
| KR | 10-2010-0082935 A | 7/2010 |
| KR | 10-2011-0021259 A | 3/2011 |
| KR | 10-2011-0037220 A | 4/2011 |
| KR | 10-2012-0068598 A | 6/2012 |
| KR | 10-2012-0090190 A | 8/2012 |

*Primary Examiner* — Anthony Ho
(74) *Attorney, Agent, or Firm* — Christie, Parker & Hale, LLP

(57) ABSTRACT

A thin film transistor array substrate includes: a substrate; a bottom gate electrode including a gate area doped with ion impurities and undoped areas on left and right sides of the gate area; an active layer on the bottom gate electrode with a first insulating layer therebetween and including a source contact region, a drain contact region, and an oxide semiconductor region; a top gate electrode on the active layer with a second insulating layer therebetween; and a source electrode in contact with the source contact region and a drain electrode in contact with the drain contact region, the source electrode and the drain electrode being on the top gate electrode with a third insulating layer therebetween. The oxide semiconductor region is between the source contact region and the drain contact region.

16 Claims, 8 Drawing Sheets

THIN FILM TRANSISTOR ARRAY SUBSTRATE, ORGANIC LIGHT-EMITTING DISPLAY APPARATUS AND METHOD OF MANUFACTURING THE THIN FILM TRANSISTOR ARRAY SUBSTRATE

CROSS-REFERENCE TO RELATED APPLICATION

This application claims priority to and the benefit of Korean Patent Application No. 10-2013-0133831, filed on Nov. 5, 2013 in the Korean Intellectual Property Office, the entire content of which is incorporated herein by reference.

BACKGROUND

1. Field

Aspects of one or more embodiments of the present invention relate to a thin film transistor array substrate, an organic light-emitting display apparatus, and a method of manufacturing the thin film transistor array substrate.

2. Description of the Related Art

A thin film transistor array substrate including thin film transistors, capacitors, and wiring connecting the thin film transistors and the capacitors is widely used in flat display apparatuses, such as liquid crystal display apparatuses or organic light-emitting display apparatuses. An organic light-emitting display apparatus including the thin film transistor array substrate defines each pixel by arranging a plurality of gate lines and data lines in a form of a matrix. Each pixel includes a thin film transistor, a capacitor, and an organic light-emitting device connected to the thin film transistor. The organic light-emitting device emits light by receiving an appropriate driving signal from the thin film transistor and the capacitor. Thus, a desired image may be displayed.

SUMMARY

One or more embodiments of the present invention include a light-emitting display apparatus having excellent device characteristics and display quality. Additional aspects will be set forth in part in the description that follows and, in part, will be apparent from the description, or may be learned by practice of the presented embodiments.

According to an embodiment of the present invention, a thin film transistor array substrate is provided. The thin film transistor array substrate includes: a substrate; a bottom gate electrode including a gate area doped with ion impurities and undoped areas on left and right sides of the gate area; an active layer on the bottom gate electrode with a first insulating layer therebetween and including a source contact region, a drain contact region, and an oxide semiconductor region; a top gate electrode on the active layer with a second insulating layer therebetween; and a source electrode in contact with the source contact region and a drain electrode in contact with the drain contact region, the source electrode and the drain electrode being on the top gate electrode with a third insulating layer therebetween. The oxide semiconductor region is between the source contact region and the drain contact region.

The gate area may not overlap the source contact region or the drain contact region.

The bottom gate electrode and the top gate electrode may be connected to each other.

The bottom gate electrode may include amorphous silicon or poly silicon.

A thickness of the first insulating layer or the second insulating layer may be less than or equal to a thickness of the third insulating layer.

A thickness of the top gate electrode may be greater than or equal to a thickness of the source contact region or the drain contact region.

A length of the oxide semiconductor region may be less than or equal to a threshold value.

The oxide semiconductor region may include at least one oxide selected from gallium indium zinc oxide (G-I—Z—O), zinc (Zn), indium (In), gallium (Ga), tin (Sn) cadmium (Cd), germanium (Ge), hafnium (Hf), or a combination thereof.

According to another embodiment of the present invention, an organic light-emitting display apparatus is provided. The organic light-emitting display apparatus includes: a first transistor including a bottom gate electrode, a first active layer including a contact region and an oxide semiconductor region, a top gate electrode, a first source electrode, and a first drain electrode; a second transistor including a second active layer of a same layer and of a same material as the bottom gate electrode, a gate electrode of a same layer and of a same material as the contact region, and a second source electrode and a second drain electrode of a same layer and of a same material as the first source electrode and the first drain electrode; and a light-emitting device including a pixel electrode, an interlayer, and a counter electrode. The oxide semiconductor region is between a source contact region and a drain contact region of the contact region. A region of the bottom gate electrode not overlapping the source contact region or the drain contact region is doped with ion impurities.

The bottom gate electrode may include a gate area of a silicon semiconductor and doped with ion impurities, and undoped areas on left and right sides of the gate area.

The first transistor may be a driving transistor of the organic light-emitting display apparatus. The second transistor may be a switching transistor of the organic light-emitting display apparatus.

The first source electrode and the first drain electrode may not overlap the doped region of the bottom gate electrode.

The organic light-emitting display apparatus may further include a capacitor. The capacitor may include a first electrode of the same layer and of the same material as the contact region, and a second electrode of a same layer and of a same material as the top gate electrode.

The capacitor may further include a third electrode of the same layer and of the same material as the first source and first drain electrodes.

The bottom gate electrode may include amorphous silicon or poly silicon.

The second transistor may include an auxiliary gate electrode of a same layer and of a same material as the top gate electrode.

In yet another embodiment of the present invention, a method of manufacturing a thin film transistor array substrate is provided. The method includes: patterning a silicon layer formed on a substrate to form a bottom gate electrode; forming a first insulating layer on the patterned silicon layer; patterning a first conducting layer formed on the first insulating layer to form a source contact region and a drain contact region; doping ion impurities on the bottom gate electrode using the source contact region and the drain contact region as a mask; patterning an oxide semiconductor layer formed on the first conducting layer to form an oxide semiconductor region between the source contact region and the drain contact region; forming a second insulating layer on the patterned first conducting layer and the patterned oxide semiconductor layer; forming a top gate electrode on the second insulating layer; forming a third insulating layer on the top gate electrode; forming contact holes in the third insulating layer and the second insulating layer corresponding to the source contact region and the drain contact region; and forming a source electrode and a drain electrode respectively in contact with the source contact region and the drain contact region through the contact holes.

BRIEF DESCRIPTION OF THE DRAWINGS

These and other aspects will become more apparent and more readily appreciated from the following description of example embodiments, taken in conjunction with the accompanying drawings in which.

DETAILED DESCRIPTION

Figure 1:
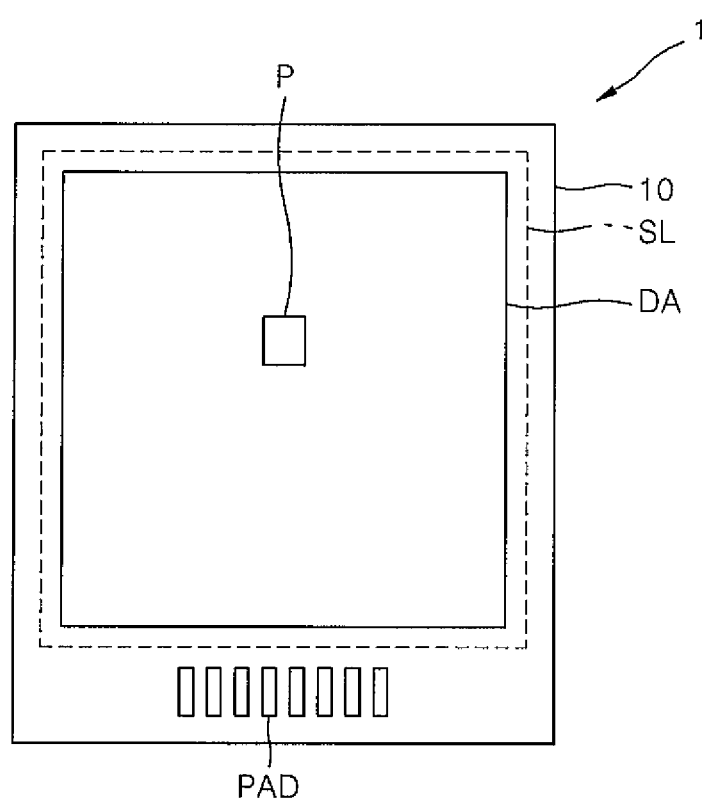
FIG. 1 is a plan view schematically illustrating an organic light-emitting display apparatus according to an embodiment of the present invention.

Reference will now be made in detail to example embodiments, as illustrated in the accompanying drawings, wherein like reference numerals refer to like elements throughout. In this regard, the present invention may have different forms and should not be construed as being limited to the embodiments set forth herein. Accordingly, the description of the embodiments, with reference to the figures, better explain aspects of the present invention.

While the invention is amenable to various modifications and alternative forms, specific embodiments have been shown by way of example in the drawings and are described in detail below. Aspects and features of the present invention, and implementation methods thereof, will be clarified through the following embodiments described with reference to the accompanying drawings. Like reference numerals in the drawings denote like elements. Accordingly, their descriptions may not be repeated.

It will be understood that although the terms "first," "second," etc., may be used herein to describe various components, these components should not be limited by these terms. These components are only used to distinguish one component from another. As used herein, the singular forms "a," "an," and "the" are intended to include the plural forms as well, unless the context clearly indicates otherwise. It will be further understood that the terms "comprises" or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the embodiments of the present invention are not limited thereto.

Different embodiments may be implemented differently, such as following different process orders. For example, consecutively described process steps may, in other embodiments, be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

FIG. 1 is a plan view schematically illustrating an organic light-emitting display apparatus 1 according to an embodiment of the present invention.

Referring to FIG. 1, a display area DA for displaying an image includes a plurality of pixels P and is formed on a substrate 10 of the organic light-emitting display apparatus 1. The display area DA is formed inside an area delimited by a sealing line SL, and a sealing member seals the display area DA along the sealing line SL. Thin film transistors and organic light-emitting devices constitute the plurality of pixels P and are arranged in the display area DA.

Figure 2:
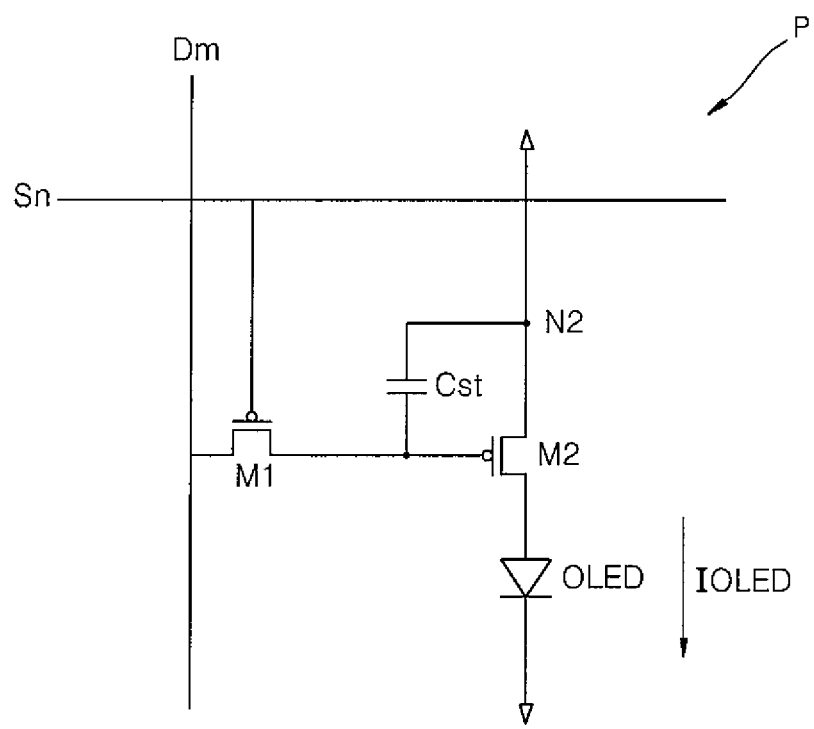
FIG. 2 illustrates an example of an equivalent circuit of a single pixel according to an embodiment of the present invention.

FIG. 2 illustrates an example of an equivalent circuit of a single pixel P according to an embodiment of the present invention.

Each of the plurality of pixels P may include a switching transistor M1, a driving transistor M2, a storage capacitor Cst, and an organic light-emitting device OLED. According to an embodiment of the present invention, when a signal of a scan line Sn is activated, a voltage level of a data line Dm is stored in the storage capacitor Cst through the switching transistor M1. The driving transistor M2 generates a light-emitting current $I_{OLED}$ according to a gate-source voltage Vgs determined by the voltage level stored in the storage capacitor Cst, and outputs the current $I_{OLED}$ to the organic light-emitting device OLED. According to an embodiment of the present invention, the organic light-emitting device OLED may be an organic light-emitting diode.

In order to drive the organic light-emitting device OLED, the switching transistor M1 may be sequentially turned on (for example, with respect to the switching transistors M1 in pixels P of other rows of the display area DA) and turned off by a gate signal, which is applied to the scan line Sn in a set or predetermined period of time. Concurrently (e.g., simultaneously), a data voltage, which is applied to the data line Dm, may be stored in the storage capacitor Cst connected to the driving transistor M2 while the switching transistor M1 is turned on. The switching transistor M1 and the driving transistor M2 may each be a thin film transistor.

However, since a voltage drop occurs in the scan line Sn as the resolution and size of the organic light-emitting display apparatus 1 increase, switching transistors M1 included in, for example, the same row of pixels P may not be turned on/off together in a set or predetermined period of time. To alleviate this, high conductivity wiring may be used or a thickness of the wiring may be increased in order to decrease resistance of the wiring, such as for the scan line Sn. In addition, a thickness of an insulator may be increased, or parasitic capacitance of a thin film transistor connected to the lines may be decreased in order to decrease parasitic capacitance generated between overlapping wiring.

Figure 3A:
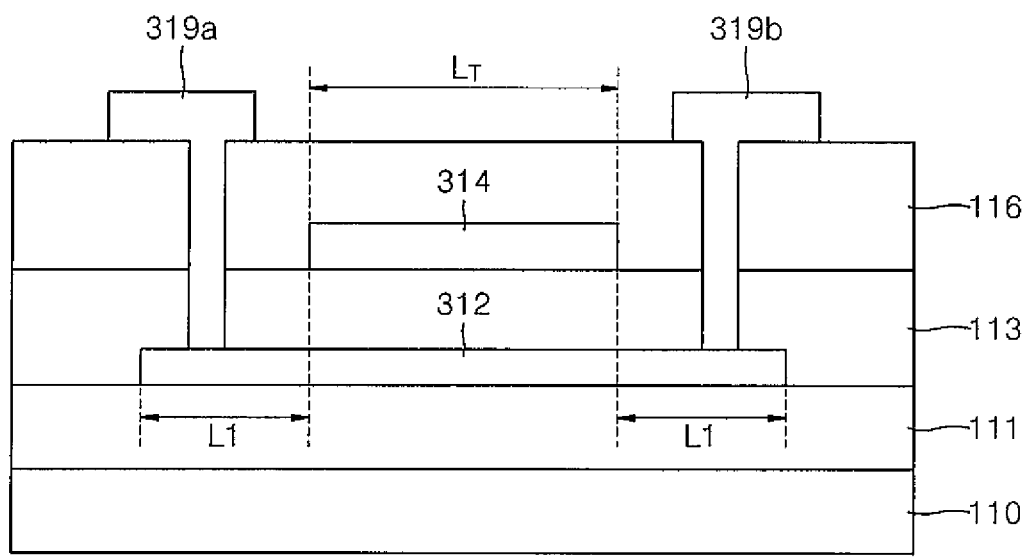
FIGS. 3A and 3B illustrate comparative examples of thin film transistors.
Figure 3B:
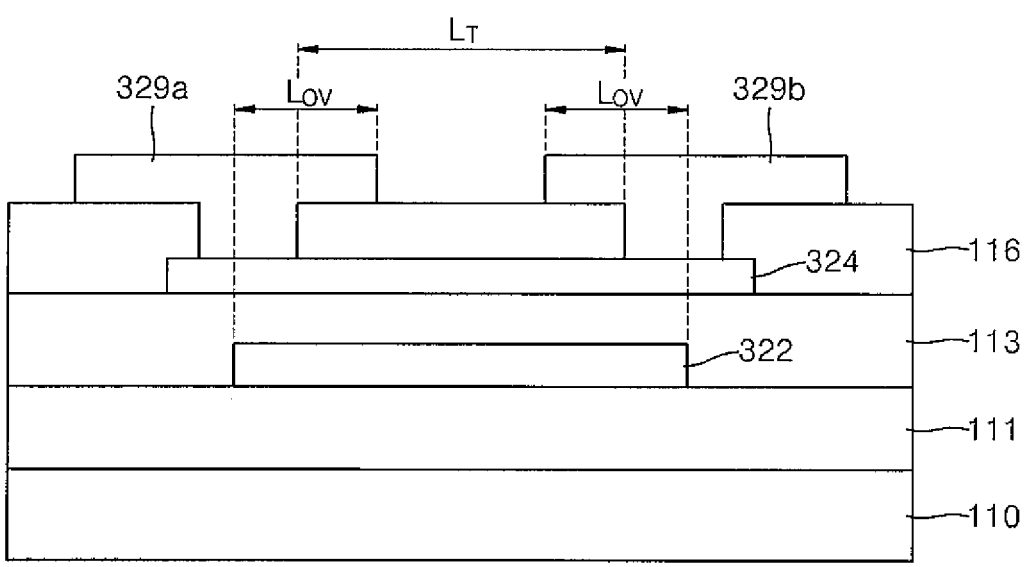

FIGS. 3A and 3B illustrate comparative examples of thin film transistors. In referring to Comparative Examples 1 and 2 of FIGS. 3A and 3B, respectively, descriptions unnecessary for the comparison with embodiments of the present invention may be omitted.

FIG. 3A illustrates a thin film transistor prepared according to Comparative Example 1.

The thin film transistor having a top-gate structure shown in FIG. 3A includes a single silicon active layer 312 as an active layer on a buffer layer 111 and a substrate 110. The silicon active layer 312 may be formed of a semiconductor including amorphous silicon or poly silicon. The silicon active layer 312 may include a channel area $L_T$ in the center and doping areas L1 outside the channel area $L_T$ doped with ion impurities. Here, the doping areas L1 may include a source area (L1 on the left) and a drain area (L1 on the right), and conductivity of the doping area L1 may increase since $N^+$ or $P^+$ ion impurities are doped by having a gate electrode 314 on the channel area $L_T$ serve as a mask.

The silicon active layer 312 may be formed of amorphous silicon or poly silicon. Here, poly silicon may be formed by crystallizing amorphous silicon. A method of crystallizing amorphous silicon may be performed by rapid thermal annealing (RTA), solid phase crystallization (SPC), excimer laser annealing (ELA), metal induced crystallization (MIC), metal induced lateral crystallization (MILC), or sequential lateral solidification (SLS). The doping areas L1 of the silicon active layer 312 may contact a source electrode 319a and a drain electrode 319b through contact holes formed in a first insulating layer 113 and a second insulating layer 116.

The silicon active layer 312 has excellent electron mobility, but when current leakage occurs at a high voltage, a voltage stored in the storage capacitor Cst may be changed or reduced during operation of the thin film transistor. Thus, a size of the storage capacitor Cst needs to be increased to prevent the change in the voltage, but increasing a size of the storage capacitor Cst causes a decrease in an opening ratio or aperture of the organic light-emitting display apparatus 1. Thus, lifespan of the organic light-emitting display apparatus 1 decreases, and power consumption increases due to an increase in driving voltage. Therefore, in embodiments of the present invention, an oxide semiconductor with excellent current leakage suppressing characteristics while having low electron mobility may be used as an active layer of a switching transistor to suppress occurrence of current leakage.

FIG. 3B illustrates a thin film transistor prepared according to Comparative Example 2.

The thin film transistor shown in FIG. 3B includes a gate electrode 322 formed on a buffer layer 111 and a substrate 110. In addition, an oxide active layer 324 is formed on the gate electrode 322 with a first insulating layer 113 therebetween.

The oxide active layer 324 may include an oxide semiconductor. For example, the oxide active layer 324 may include an $(In_2O_3)_a(Ga_2O_3)_b(ZnO)_c$ (G-I—Z—O) layer (where a, b, and c are numbers respectively satisfying conditions of a≥0, b≥0, and c>0), and in addition, may include an oxide of a material selected from the group consisting of Groups 12, 13, and 14 metallic elements, such as zinc (Zn), indium (In), gallium (Ga), tin (Sn), cadmium (Cd), germanium (Ge), or hafnium (Hf), and a combination thereof.

A second insulating layer 116 is formed on the oxide active layer 324, and the oxide active layer 324 contacts a source electrode 329a and a drain electrode 329b through contact holes formed in the second insulating layer 116. In comparable thin film transistors to the thin film transistor shown in FIG. 3B, the second insulating layer 116 may serve as an etch stop layer for protecting the oxide active layer 324 while patterning the source electrode 329a and the drain electrode 329b.

The thin film transistor in FIG. 3B includes overlap areas Lov in which the gate electrode 322 overlaps with the source electrode 329a or the drain electrode 329b with an insulating layer therebetween. The gate electrode 322, together with the source electrode 329a and the drain electrode 329b in the overlap areas Lov serve as capacitors and generate parasitic capacitance. This causes a voltage drop (RC load) when operating the organic light-emitting display apparatus 1. As shown in FIG. 3B, when the bottom gate thin film transistor structure is turned on, the gate electrode 322, the first insulating layer 113, and the oxide active layer 324 form a capacitor with the oxide active layer 324 serving as a conductor. In addition, when turned off, parasitic capacitance is generated by the oxide active layer 324, the second insulating layer 116, and the source and drain electrodes 329a and 329b that form capacitors.

Therefore, when the thin film transistor of FIG. 2 is the oxide transistor shown in FIG. 3B, resistance in the lines increases due to parasitic capacitance from turning the thin film transistor on or off. In a large-size high-resolution display, turning the switching transistor M1 on and off may be impossible in a short period of time due to signal delay caused by the resistance and the parasitic capacitance. In addition, when storing a signal voltage of the data line Dm in the storage capacitor Cst connected to the driving transistor M2, time to charge a data voltage may be insufficient due to the signal delay caused by the resistance and the parasitic capacitance of the data line Dm.

When a thickness of the first insulating layer 113 is increased to reduce the parasitic capacitance, a turned-on current of the thin film transistor reduces. Thus, the storage capacitor Cst that is used for the pixel P connected to the switching transistor M2 may not be charged in a short period of time. In addition, in order to reduce the signal delay, a thickness of the signal line, such as the gate electrode 322, may be increased, but then a thickness of the first insulating layer 113 also needs to be increased to prevent short circuits. Thus, current driving capability of the oxide transistor shown in FIG. 3B decreases and a charging time of the storage capacitor Cst increases.

That is, the resistance may be decreased by increasing thicknesses of metal lines (such as the gate electrode, the source electrode, and the drain electrode), but in reference to FIG. 3B, when a thickness of the gate electrode 322 increases, a thickness of the insulating layer 113 needs to be increased to prevent short circuits. Consequently, a charging time of the storage capacitor Cst increases as current driving capability of the oxide transistor shown in FIG. 3B decreases. Thus, implementing a large-size high-resolution display may be difficult.

In another comparable thin film transistor including the oxide active layer 324, a thin film transistor having a top-gate structure as shown in FIG. 3A may be used to reduce parasitic capacitance caused by the overlap described above. That is, an oxide active layer may be used instead of the silicon active layer 312 shown in FIG. 3A. In this regard, resistance of the doping area L1 may be decreased and conductivity of the doping area L1 may be increased by doping areas other than the channel area $L_T$ by using the gate electrode as a mask. However, the thin film transistor having the top-gate structure may be difficult to decrease resistances of the source area L1 and the drain area L1 by performing doping, unlike a transistor having the oxide active layer 324, and when ion-doping is performed to increase the conductivity, property variation of the thin film transistor may occur or reliability of the thin film transistor may be reduced.

In addition, the oxide active layer thin film transistor shown in FIG. 3B may not reduce a length of the channel area $L_T$ to a standard value or more due to the problems of a process. Therefore, an area occupied by the thin film transistor in the organic light-emitting display apparatus 1 is enlarged, and this may cause a decrease in an opening ratio (or aperture) and difficult operation of a large-sized thin film transistor.

In embodiments of the present invention, since the organic light-emitting display apparatus 1 includes thin film transistors in which parasitic capacitance is decreased, current flowing through the thin film transistors is increased when the thin film transistors are turned on, and current leakage is decreased when the thin film transistors are turned off, compared to the thin film transistors according to Comparative Examples 1 and 2 shown in FIGS. 3A and 3B. Accordingly, operation of a large-size display apparatus is possible.

Figure 4:
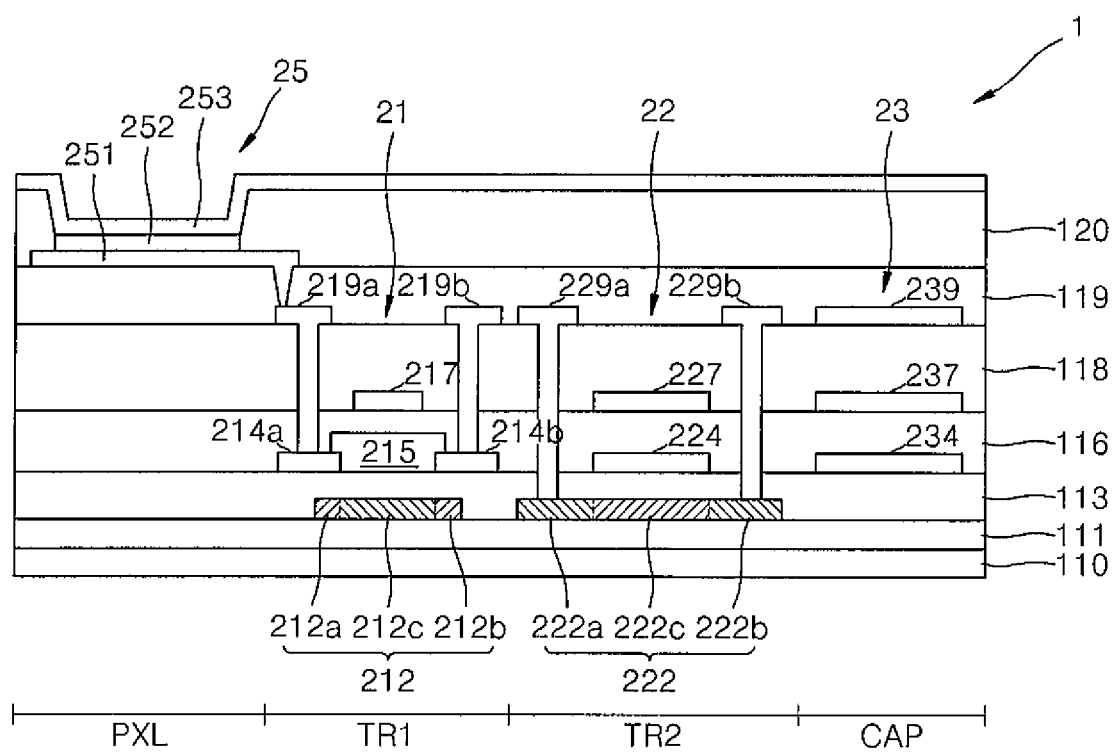
FIG. 4 is a cross-sectional view schematically illustrating an organic light-emitting display apparatus according to an embodiment of the present invention.

FIG. 4 is a cross-sectional view schematically illustrating the organic light-emitting display apparatus 1 according to an embodiment of the present invention.

The organic light-emitting display apparatus 1 includes a light-emitting device 25 in a pixel area PXL, a first transistor 21 in a first transistor area TR1, a second transistor 22 in a second transistor area TR2, and a capacitor 23 in a capacitor area CAP. Referring to FIGS. 4 and 2, the first transistor 21 corresponds to the driving transistor M2, the second transistor 22 corresponds to the switching transistor M1, and the capacitor 23 corresponds to the storage capacitor Cst.

The first transistor 21 is formed on a substrate 110 and a buffer layer 111, and includes a bottom gate electrode 212, a first insulating layer 113, active layers 214a, 214b, and 215, a second insulating layer 116, a top gate electrode 217, a third insulating layer 118, a source electrode 219a, and a drain electrode 219b. The substrate 110 may be formed of a glass substrate or a plastic substrate including polyethylen terephthalate (PET), polyethylen naphthalate (PEN), or polyimide.

The buffer layer 111 for forming a flat surface and blocking penetration of impurity elements may be further included on a top of the substrate 110. The buffer layer may have a structure of a single layer or multiple layers formed of silicon nitride and/or silicon oxide.

The bottom gate electrode 212 is disposed on the buffer layer 111. The bottom gate electrode 212 includes amorphous silicon or poly silicon. Here, the bottom gate electrode 212 includes a gate area 212c that is doped with $N^+$ or $P^+$ ion impurities and undoped areas 212a and 212b that are not doped with ion impurities. The undoped area 212a on the left overlaps a source contact region 214a, and the undoped area 212b on the right overlaps a drain contact region 214b.

Since the gate area 212c is doped with ion impurities, conductivity of the gate area 212c increases and electron mobility of the gate area 212c is excellent. Thus, the gate area 212c operates as a bottom gate. In addition, the source and drain areas 212a and 212b are undoped and overlap only a small portion of the source contact region 214a or the drain contact region 214b, which are formed of metal. Thus, parasitic capacitance is reduced or minimized in the undoped areas 212a and 212b.

The first insulating layer 113 is disposed on the bottom gate electrode 212. The first insulating layer 113 has a structure of a single layer or multiple layers formed of an inorganic insulating layer, and examples of the inorganic insulating layer forming the first insulating layer 113 may include $SiO_2$, $SiN_x$, SiON, $Al_2O_3$, $TiO_2$, $Ta_2O_5$, $HfO_2$, $ZrO_2$, BST, and PZT.

The active layers 214a, 214b, and 215 are disposed on the first insulating layer 113. The active layers 214a, 214b, and 215 include the source contact region 214a, the drain contact region 214b, and an oxide semiconductor region 215. The oxide semiconductor region 215 may be disposed in a space between the source contact region 214a and the drain contact region 214b.

The source contact region 214a and the drain contact region 214b are formed of a material having a high conductivity. For example, each of the source contact region 214a and the drain contact region 214b may have a structure of a single layer or multiple layers formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The source contact region 214a and the drain contact region 214b may be respectively connected to the source electrode 219a and the drain electrode 219b through contact holes.

The oxide semiconductor region 215 disposed in the space between the source contact region 214a and the drain contact region 214b may include an oxide semiconductor. For example, the oxide semiconductor 215 may include an $(In_2O_3)_a(Ga_2O_3)_b(ZnO)_c$ (G-I—Z—O) layer (where a, b, and c are numbers respectively satisfying conditions of a≥0, b≥0, and c>0), and in addition, may include an oxide of a material selected from the group consisting of Groups 12, 13, and 14 metallic elements, such as zinc (Zn), indium (In), gallium (Ga), tin (Sn), cadmium (Cd), germanium (Ge), or hafnium (Hf), and a combination thereof. The oxide semiconductor region 215 forms a channel area of the first transistor 21.

In the first transistor 21, channel length may be reduced up to 5 μm to 7 μm in a manufacturing process when the oxide semiconductor region 215 disposed between the source contact region 214a and the drain contact region 214b is used as a channel of the thin film transistor, and the source contact region 214a and the drain contact region 214b are formed before the oxide semiconductor region 215. Therefore, unlike the comparable transistors illustrated in FIG. 3A or FIG. 3B, a length of the semiconductor region 215, i.e., a channel length, may be decreased to a length less than or equal to a threshold length. Thus, as a size of the transistor is reduced, capacitance formed by the channel of the transistor decreases. In addition, on-current of the transistor increases as resistance of the transistor channel decreases due to a reduction in the length of the channel. Thus, when the transistor is used as a switching device, a high-speed operation of an apparatus may be enabled as resistance and capacitance decrease.

The second insulating layer 116 is disposed on the active layer 214a, 214b, and 215. The second insulating layer 116 may be formed as a single layer or multiple layers formed of at least one inorganic insulating layer, wherein examples of the inorganic insulating layer forming the second insulating layer 116 may include $SiO_2$, $SiN_x$, SiON, $Al_2O_3$, $TiO_2$, $Ta_2O_5$, $HfO_2$, $ZrO_2$, BST, and PZT.

The thickness of the first insulating layer 113 or the second insulating layer 116 according to an embodiment of the present invention may be reduced less than that of a conventional thin film transistor. In addition, the thickness of the first insulating layer or the second insulating layer is less than or equal to a thickness of the third insulating layer 118. The thickness of the conventional thin film transistor is difficult to reduce to a certain thickness or less.

In the conventional thin film transistor, when the thickness of the first insulating layer 113 or the second insulating layer 116 is increased to decrease parasitic capacitance, on-current may be reduced (where the on-current is current that flows when the thin film transistor operates). However, according to an embodiment of the present invention, in the bottom gate electrode 212, only the gate area 212c, which is an area not overlapping the source contact region 214a or the drain contact region 214b (which serve as conductors), is doped and serves as a conductor. Thus, the parasitic capacitance may not be increased, so a thickness of the first insulating layer 113 or the second insulating layer 116 may be reduced.

Therefore, when the first insulating layer 113 or the second insulating layer 116 with a reduced thickness is used, a high-capacity current may be formed in a thin film transistor having a small area. Accordingly, the area occupied by the thin film transistor in an organic light-emitting display apparatus is reduced. Thus, an RC delay phenomenon generated during an operation of a large-size display may be reduced. Therefore, a high-speed operation of the organic light-emitting display apparatus is enabled. Additionally, when a large-size high-resolution display is formed, the area occupied by the thin film transistor may be reduced. Thus, an opening ratio (e.g., aperture) increases, and a decrease in a driving voltage according to the increase of the opening ratio and an increase in lifespan of the organic light-emitting display apparatus may be expected.

The top gate electrode 217 is disposed on the second insulating layer 116. The top gate electrode 217 has a structure of a single layer or multiple layers formed of at least one metal selected from, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). In addition, the top gate electrode 217 may form dual wiring by being connected to the bottom gate electrode 212, and the same signal with the bottom gate electrode 212 may be applied to the top gate electrode 217. A thickness of the top gate electrode 217 may be increased to reduce resistance. For example, the thickness of the top gate electrode 217 may be greater than or equal to a thickness of the source contact region 214a or the drain contact region 214b.

According to an embodiment of the present invention, the top gate electrode 217 having a low resistance may be included in the organic light-emitting display apparatus 1 in addition to the bottom gate electrode 212 having a higher resistance. Thus, resistance problems that may be caused when wiring is only done with the bottom gate electrode 212 of a silicon material may be resolved. In addition, once electrons are injected by a voltage applied to the bottom gate electrode 212 formed of a high-resistant silicon material, a current increases and a high-speed operation of the display apparatus may be enabled as more electrons may be injected to a channel by a voltage applied to the additionally formed top gate electrode 217 having a low resistance.

In the top gate oxide transistor having a structure shown in FIG. 3A the gate electrode 314, the source electrode 319a, and the drain electrode 319b do not overlap. Thus, parasitic capacitance of the transistor is reduced, but on-current of the transistor decreases due to a significantly high resistance of the doped silicon contact areas (corresponding to the doping areas $L_1$) since a gate voltage is not applied to these contact areas of the source electrode 319a and the drain electrode 319b but rather only to a channel area (corresponding to channel area $L_T$) between the contact (doped) areas under the gate electrode 314. In addition, in the oxide thin film transistor as shown in FIG. 3B, an on-current reduction phenomenon caused by contact resistance (such as contact resistance of the source electrode 329a or the drain electrode 329b and the active layer 324) generated when only the bottom gate electrode 322 is used may occur.

However, the first transistor 21 shown in FIG. 4 includes the bottom gate electrode 212 and the top gate electrode 217 at the same time. Thus, contact resistance is reduced. Therefore, on-current of the first transistor 21 increases compared to that of the conventional thin film transistor. Thus, a high-speed operation of a large-size high-resolution display is enabled.

The third insulating layer 118 is disposed on the top gate electrode 217. The third insulating layer 118 having a structure of a single layer or multiple layers is formed of an inorganic insulating layer, and examples of the inorganic insulating layer forming the third insulating layer may include $SiO_2$, $SiN_x$, SiON, $Al_2O_3$, $TiO_2$, $Ta_2O_5$, $HfO_2$, $ZrO_2$, BST, and PZT.

According to an embodiment of the present invention, the third insulating layer 118 may be formed thicker than the first insulating layer 113 or the second insulating layer 116. Since the third insulating layer 118 is disposed on the top gate electrode 217, parasitic capacitance may be reduced or minimized by forming the third insulating layer 118 thick while not affecting current when operating the thin film transistor. In addition, as described above, when the top gate electrode 217 is formed thick, the third insulating layer 118 may be formed thick in order to sufficiently cover (insulate) the top gate electrode 217.

The source electrode 219a and the drain electrode 219b are disposed on the third insulating layer 118. The source electrode 219a and the drain electrode 219b are respectively connected to the source contact region 214a and the drain contact region 214b through contact holes prepared in the third insulating layer 118 and the second insulating layer 116.

The source electrode 219a and the drain electrode 219b may have a structure of at least two metal layers having different electron mobilities. For examples, the at least two metal layers may be selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and an alloy thereof.

When only the gate area 212c of the bottom gate electrode 212 is doped with $N^+$ or $P^+$ ion impurities as in the first transistor 21, the gate area 212c has a high electron mobility, and the undoped areas 212a and 212b serve as an insulator. Thus, areas of the source contact region 214a and the drain contact region 214b in the gate area 212c of the bottom gate electrode 212 do not form parasitic capacitance.

In addition, on-current of the first transistor 21 may be increased by reducing resistance between the source electrode 219a or the drain electrode 219b and the oxide semiconductor region 215 operating as a channel area as the source contact region 214a and the drain contact region 214b of the first transistor 21 are formed of a conductor having a high conductivity. That is, a device reliability may improve at the same time of increasing conductivity compared to doping an oxide semiconductor with ion impurities.

In addition, the first transistor 21 has the oxide semiconductor region 215 in the channel area. Thus, current leakage when the thin film transistor is OFF may be suppressed more than when the channel area only includes silicon.

The second transistor 22 located in the second transistor area TR2 includes an active layer 222, a gate electrode 224, an auxiliary gate electrode 227, a source electrode 229a, and a drain electrode 229b. In addition, descriptions of the substrate 110, the buffer layer 111, the first insulating layer 113, the second insulating layer 116, and the third insulating layer 118 are substantially the same as those in the first transistor 21 described above. Accordingly, these descriptions are not repeated.

The active layer 222 of the second transistor 22 includes amorphous silicon or polysilicon as with the bottom gate electrode 212 of the first transistor 21. The active layer 222 includes a source area 222a and a drain area 222b doped with $N^+$ or $P^+$ ion impurities and a channel area 222c that is not doped with any ion impurities.

The gate electrode 224 of the second transistor 22 is formed from the same layer and with the same material as the source contact region 214a and the drain contact region 214b of the first transistor 21. In addition, the auxiliary gate electrode 227 is formed from the same layer and with the same material as the top gate electrode 217 of the first transistor 21.

In the embodiment of FIG. 4, the second transistor 22 additionally includes the auxiliary gate electrode 227 when compared to the thin film transistor according to Comparative Example 1 shown in FIG. 3A. The auxiliary gate electrode 227, may form dual wiring by being connected to the gate electrode 224. Thus, resistance may be reduced. In another embodiment, the second transistor 22 may not include the auxiliary gate electrode 227.

The source electrode 229a and the drain electrode 229b of the second transistor 22 are formed from the same layer and of the same material as the source electrode 219a and the drain electrode 219b of the first transistor 21.

A capacitor 23 is located in a capacitor area CAP. The capacitor 23 includes a first electrode 234, a second electrode 237, and a third electrode 239. The first electrode 234 is formed from the same layer and of the same material as the source contact region 214a and the drain contact region 214b of the first transistor 21. The second electrode 237 is formed of the same layer and of the same material as the top gate electrode 217 of the first transistor 21. In addition, the third electrode 239 is formed from the same layer and of the same material as the source electrode 219a and the drain electrode 219b of the first transistor 21.

According to an embodiment of the present invention, a thickness of the second insulating layer 116 may be thinner than a thickness of a conventional thin film transistor. Thus, a size of an electrostatic capacity of a capacitor formed by the first electrode 234 and the second electrode 237 increases. Thus, when a large-size high-resolution display is formed, the capacitor area CAP may be reduced. Accordingly, an opening ratio or aperture may increase, and a decrease in a driving voltage according to the increase in the opening ratio and an increase in a lifespan of the organic light-emitting display apparatus may be expected.

The light-emitting device 25 is disposed in a pixel area PXL, and the light-emitting device 25 may include a pixel electrode 251, an interlayer (or intermediate layer or layers) 252, and a counter electrode 253. The light-emitting device 25 is disposed on a planarization layer 119. The planarization layer 119 is formed of an organic insulating layer and may serve as a planarization film. A general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof may be used as the organic insulating layer.

The pixel electrode 251 is in contact with a source electrode 219a (as in FIG. 4) or a drain electrode 291b through a contact hole formed in the planarization layer 119. When the display apparatus is a bottom-emission type display apparatus, the pixel electrode 251 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In addition, the pixel electrode 251 may have a three-layer structure composed of transparent conductive oxide layer/semi-transparent metal layer/transparent conductive oxide layer.

When the display apparatus is a top-emission type display apparatus, the pixel electrode 251 may include a reflective layer formed of Al, Pt, Pd, Ag, Mg, Au, Ni, Nd, Ir, Cr, Mg, or a compound thereof and ITO, IZO, ZnO, $In_2O_3$, IGO, or AZO formed on the reflective layer.

A pixel-defining layer 120 is formed on the pixel electrode 251. The pixel-defining layer 120 serves to define the pixels and may be formed of an organic insulating layer including a general-purpose polymer (e.g., PMMA and PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof.

The intermediate layer 252 includes the organic emission layer that emits, for example, red, green, or blue light. A low molecular weight organic material or a polymer organic material may be used to form the organic emission layer. When the organic emission layer is a low molecular weight organic layer formed of a low molecular weight organic material, a hole transport layer (HTL) and a hole injection layer (HIL) may be disposed in a direction of the pixel electrode 251 about the organic emission layer, and electron transport layer (ETL) and electron injection layer (EIL) may be stacked in a direction of the counter electrode 253. Various layers, in addition to the HIL, the HTL, the ETL, and the EIL, may be stacked and formed if necessary as would be apparent to one of ordinary skill.

In the above-described example embodiment, a separate organic emission layer is formed for each color of pixel. Here, each pixel may emit one of red, green, or blue light, and a pixel group that emits red, green, and blue light may constitute a single unit pixel. However, embodiments of the present invention are not limited thereto. In other embodiments, the organic emission layer may be commonly formed for all the pixel areas. For example, the plurality of organic emission layers that emit red, green, and blue light may be vertically stacked or mixed to emit white light. However, a combination of colors to emit the white light is not limited thereto. Here, a color conversion layer for converting the emitted white light into a predetermined color or a color filter may, for example, be further included.

The counter electrode 253 opposite to the pixel electrode 251 is disposed on the intermediate layer 252. The counter electrode 253 may also be formed of a transparent electrode or a reflective electrode. When a transparent electrode is used as the counter electrode 253, the counter electrode 253 may be formed in such a manner that a metal with a low work function, i.e., Li, Ca, LiF/Ca, LiF/Al, Al, Mg, or a compound thereof, is deposited to face the organic emission layer, and an auxiliary electrode or a bus electrode line formed of a transparent conductive oxide, such as ITO, IZO, ZnO, or $In_2O_3$, may then be formed thereon. When a reflective electrode is used as the counter electrode 253, the counter electrode 253 is formed by depositing Li, Ca, LiF/Ca, LiF/Al, Al, Mg, or a compound thereof on an entire surface of a display portion. However, embodiments of the present invention are not limited thereto. In other embodiments, an organic material, such as a conductive polymer, may be used as the pixel electrode 251 and the counter electrode 253.

Hereinafter, a method of manufacturing the organic light-emitting display apparatus 1 of FIG. 4 according to an embodiment of the present invention will be described with reference to FIGS. 5A through 5F.

Figure 5A:
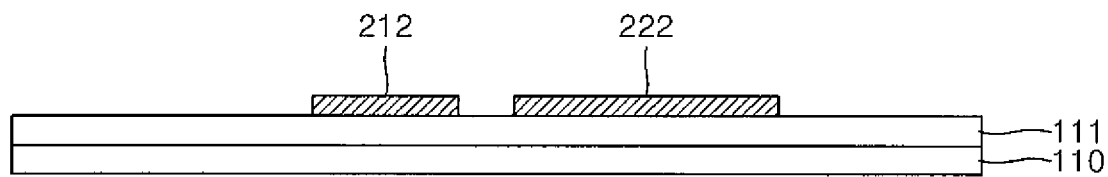
FIGS. 5A to 5F are diagrams illustrating a method of manufacturing the organic light-emitting display apparatus of FIG. 4.

FIG. 5A is a cross-sectional view schematically illustrating a first mask process for manufacturing the organic light-emitting display apparatus 1.

Referring to FIG. 5A, a buffer layer 111 is formed on a substrate 110 and a silicon semiconductor layer is formed on the buffer layer 110. Then, a bottom gate electrode 212 of a first transistor 21 and an active layer 222 of a second transistor 22 are formed by patterning the silicon semiconductor layer.

For example, the silicon semiconductor layer may be coated with a photoresist and the silicon semiconductor layer is then patterned by photolithography using a first photomask to form the bottom gate electrode 212 and the silicon active layer 222. The first mask process by photolithography is performed through a series of processes, such as developing, etching, and stripping or ashing, after exposing the first photomask with an exposure apparatus.

The silicon semiconductor layer may be formed of amorphous silicon or polysilicon. Here, the polysilicon may be formed by crystallization of the amorphous silicon. Various methods, such as rapid thermal annealing (RTA), solid phase crystallization (SPC), excimer laser annealing (ELA), metal induced crystallization (MIC), metal induced lateral crystallization (MILC), and sequential lateral solidification (SLS), may be used as a crystallization method of the amorphous silicon.

When the silicon semiconductor layer is formed of amorphous silicon, a crystallization process, such as an ELA method, may be omitted. Thus, the manufacturing process may be simplified and the manufacturing cost may be reduced.

Figure 5B:
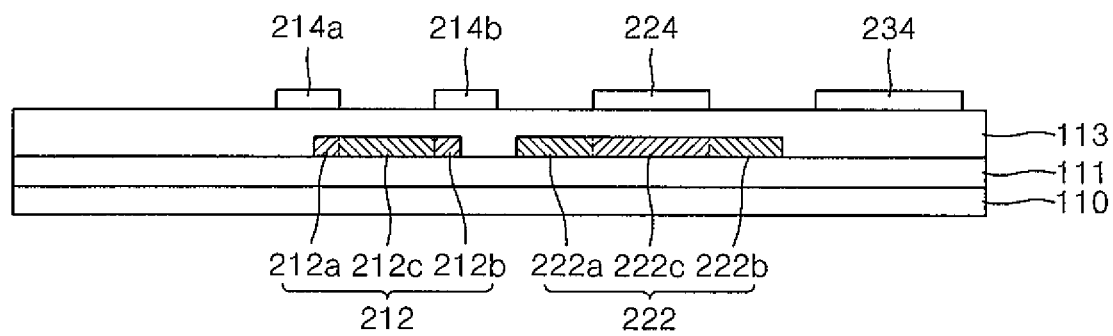

FIG. 5B is a cross-sectional view schematically illustrating a second mask process for manufacturing the organic light-emitting display apparatus 1.

After forming a first insulating layer 113 on the product of the first mask process shown in FIG. 5A, a first metal layer is formed on the first insulating layer 113, and a source contact region 214a and a drain contact region 214b of the first transistor 21, a gate electrode 224 of the second transistor 22, and a first electrode 234 of a capacitor 23 are then formed by patterning the first metal layer. The first insulating layer 113 may be formed thinner than a gate insulating layer of a conventional thin film transistor. Here, the source contact region 214a and the drain contact region 214b may be patterned in areas overlapping the bottom gate electrode 212 as well as a source electrode 219a and a drain electrode 219b.

The first metal layer may have a structure of a single layer or multiple layers formed of at least one selected from Al, Pt, Pd, Ag, Mg, Au, Ni, Nd, Ir, Cr, Li, Ca, Mo, Ti, W, and Cu. The resultant structure as described above is doped with ion impurities. $N^+$ or $P^+$ ions may be doped as the ion impurities, and the bottom gate electrode 212 and silicon active layer 222 are doped at a concentration of about $1 \times 10^{15}$ atoms/cm$^3$ or more.

The bottom gate electrode 212 and the active layer 222 are doped with ion impurities by using the source contact region 214a, the drain contact region 214b, and the gate electrode 224 as self-align masks. Thus, electron mobilities of a gate area 212c of the first transistor 21 and a source area 222a and a drain area 222b of the second transistor 22 may increase. In the second transistor 22, remaining regions excluding the source area 222a and the drain area 222b may be a channel area 222c.

Electron mobilities of undoped areas 212a and 212b of the first transistor and the source area 222a and the drain area 222b of the second transistor 22 are low. Thus, parasitic capacitance does not occur.

Figure 5C:
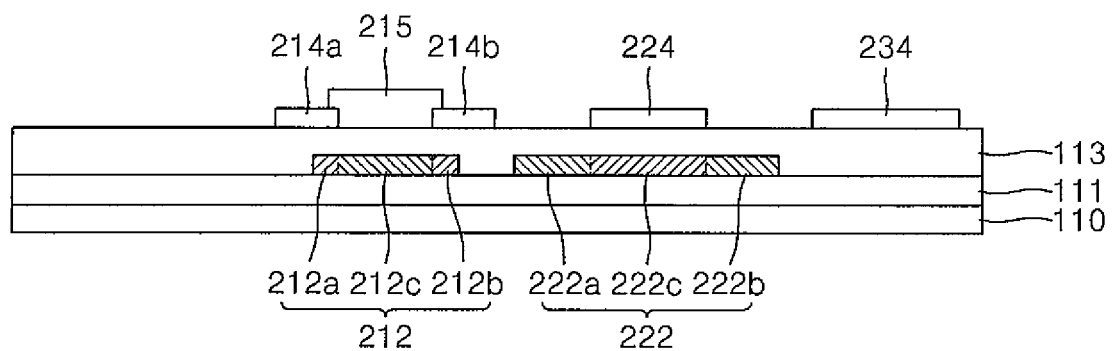

FIG. 5C is a cross-sectional view schematically illustrating a third mask process for manufacturing the organic light-emitting display apparatus 1.

An oxide semiconductor layer is formed on the product of the second mask process of FIG. 5B, and an oxide semiconductor region 215 of the first transistor 21 is then formed by patterning the oxide semiconductor layer. The oxide semiconductor region 215 may be disposed in a space between the source contact region 214a and the drain contact region 214b, and as illustrated in FIG. 5C, the oxide semiconductor region 215 may be formed to partially overlap the source contact region 214a and the drain contact region 214b.

The oxide semiconductor region 215 may include an oxide semiconductor. For example, the oxide semiconductor layer may include an $(In_2O_3)_a(Ga_2O_3)_b(ZnO)_c$ (G-I—Z—O) layer (where a, b, and c are real numbers respectively satisfying conditions a≥0, b≥0, and c>0), and in addition, may include an oxide of a material selected from the group consisting of Groups 12, 13, and 14 metallic elements, such as Zn, In, Ga, Sn, Cd, Ge, or Hf, and a combination thereof.

Figure 5D:
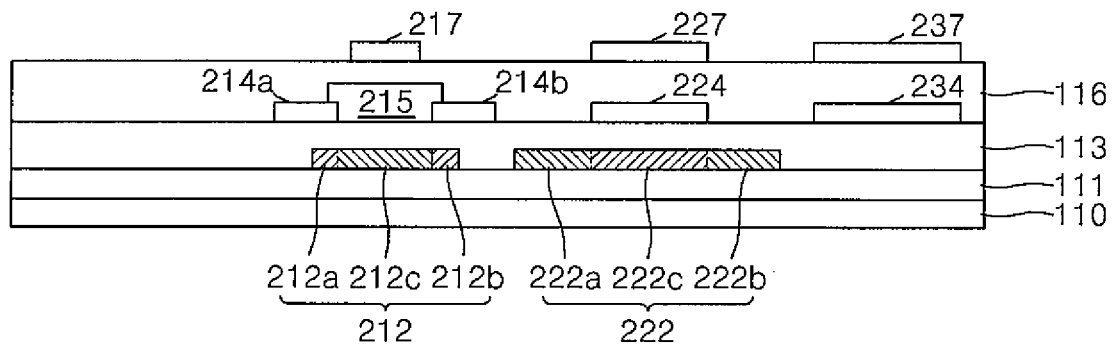

FIG. 5D is a cross-sectional view schematically illustrating a fourth mask process for manufacturing the organic light-emitting display apparatus 1.

A second insulating layer 116 is formed on the product of the third mask process of FIG. 5C, a second metal layer is stacked on the second insulating layer 116, and the second metal layer is then patterned. Here, the second metal layer may be a single layer or multiple layers formed of at least one metal selected from the group consisting of Al, Pt, Pd, Ag, Mg, Au, Ni, Nd, Ir, Cr, Li, Ca, Mo, Ti, W, and Cu. As a result of the patterning, a top gate electrode 217 of the first transistor 21, an auxiliary gate electrode 227 of the second transistor 22, and a second electrode 237 of the capacitor 23 are formed on the second insulating layer 116.

Figure 5E:
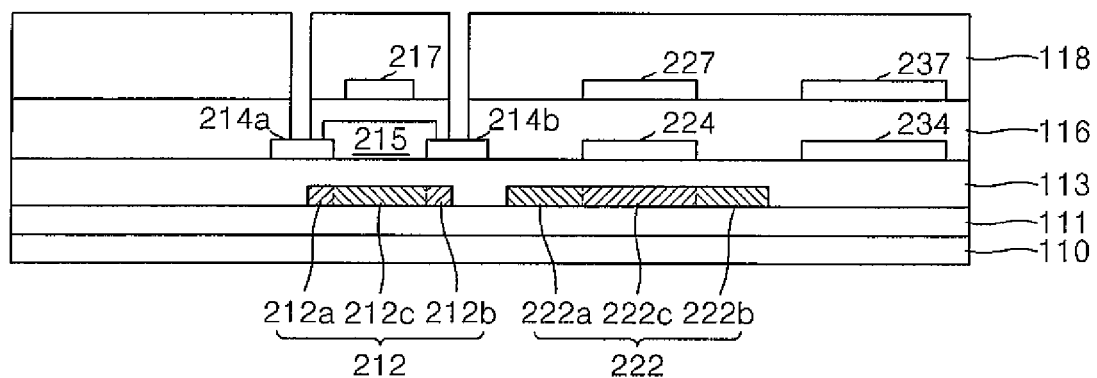

FIG. 5E is a cross-sectional view schematically illustrating a fifth mask process for manufacturing the organic light-emitting display apparatus 1.

A third insulating layer 118 is formed on the product of the fourth mask process of FIG. 5E, and the third insulating layer 118 is patterned to form openings exposing the source contact region 214a and the drain contact region 214b.

Figure 5F:
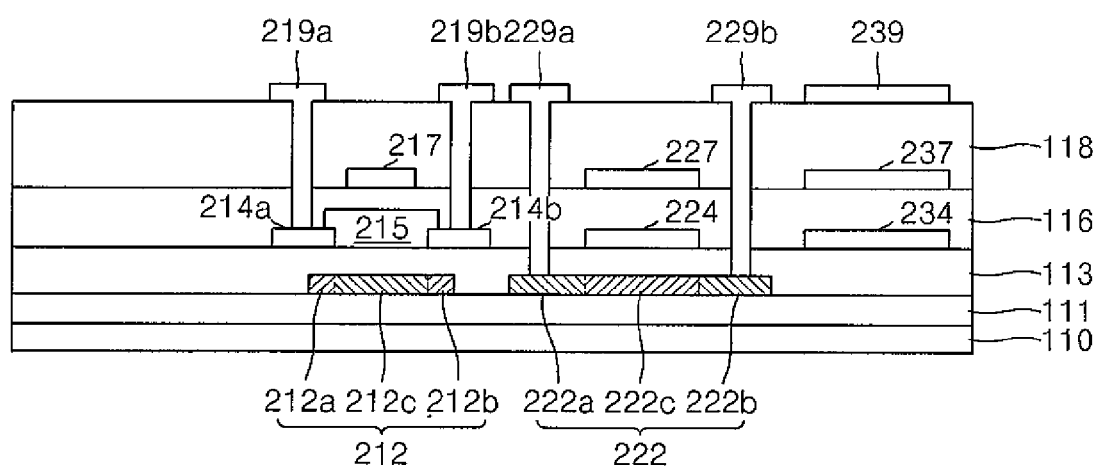

FIG. 5F is a cross-sectional view schematically illustrating a result of a sixth mask process for manufacturing the organic light-emitting display apparatus 1.

Referring to FIG. 5F, a third metal layer is formed on the product of the fifth mask process of FIG. 5E, and the third metal layer is patterned to simultaneously form the source electrode 219a and the drain electrode 219b of the first transistor 21, a source electrode 229a and a drain electrode 229b of the second transistor 22, and a third electrode 239 of the capacitor 23.

The third metal layer may be formed of two or more layers of different metals having different electron mobilities. For example, the third metal layer may be formed of two or more layers of metals selected from the group consisting of Al, Pt, Pd, Ag, Mg, Au, Ni, Nd, Ir, Cr, Li, Ca, Mo, Ti, W, Cu, and an alloy thereof.

Figure 6:
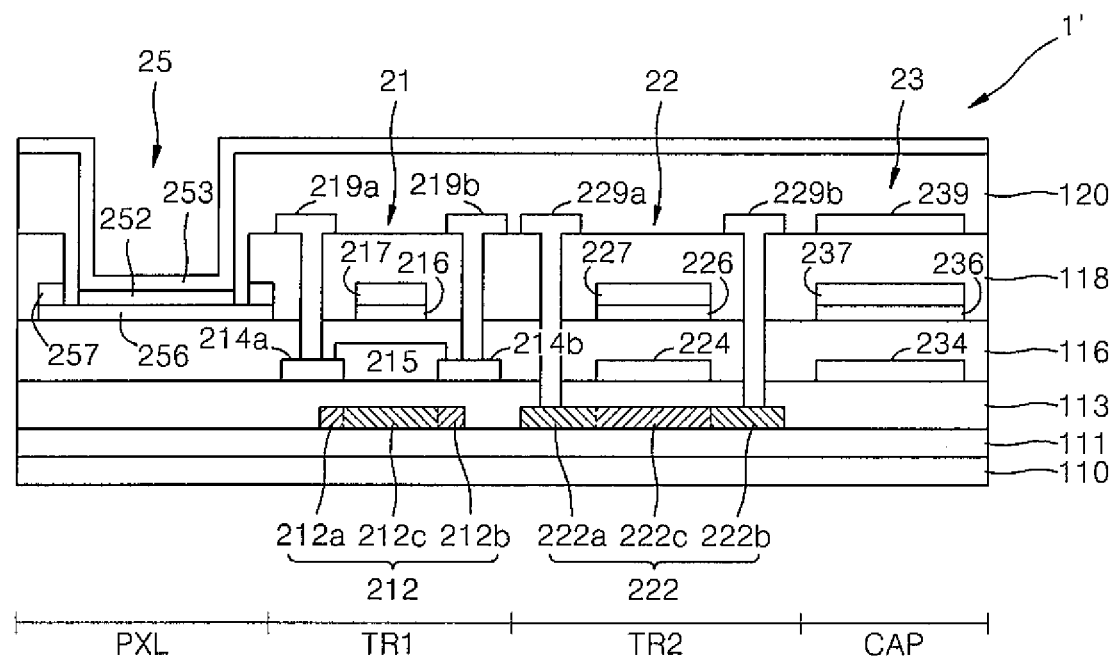
FIG. 6 is a cross-sectional view schematically illustrating an organic light-emitting display apparatus according to another embodiment of the present invention.

FIG. 6 is a cross-sectional view schematically illustrating an organic light-emitting display apparatus 1' according to another embodiment of the present invention.

The organic light-emitting display apparatus 1' is a bottom-emission type display apparatus. Reference numerals of elements of the organic light-emitting display apparatus 1' shown in FIG. 6 that are the same as reference numerals of elements of the display apparatuses shown in FIGS. 4 and 5 are like elements of the display apparatuses shown in FIGS. 4 and 5. The display apparatus shown in FIG. 6 may further include a transparent electrode layer 216 between the top gate electrode 217 and the second insulating layer 116, a transparent electrode layer 226 between the auxiliary gate electrode 227 and the second insulating layer 116, and a transparent electrode layer 236 between the second electrode 237 and the second insulating layer 116. The top gate electrode 217, the auxiliary gate electrode 227, and the second electrode 237 may each form a double-layered electrode with the transparent electrodes 216, 226, and 236, respectively.

In addition, a pixel electrode 256 of the light-emitting device 25 of the pixel area PXL may be included as a transparent electrode layer. The transparent electrode layers 216, 226, and 236 and the pixel electrode 256 are formed from the same layer with the same material and may include at least one selected from the group consisting of ITO, IZO, ZnO, In$_2$O$_3$, IGO, and AZO. Further, in an embodiment, a second pixel electrode 257 is formed on peripheral portions of the pixel electrode 256. The second pixel electrode 257 may be formed from the same layer and with the same material as the top gate electrode 217, the auxiliary gate electrode 227, and the second electrode 237.

Figure 7:
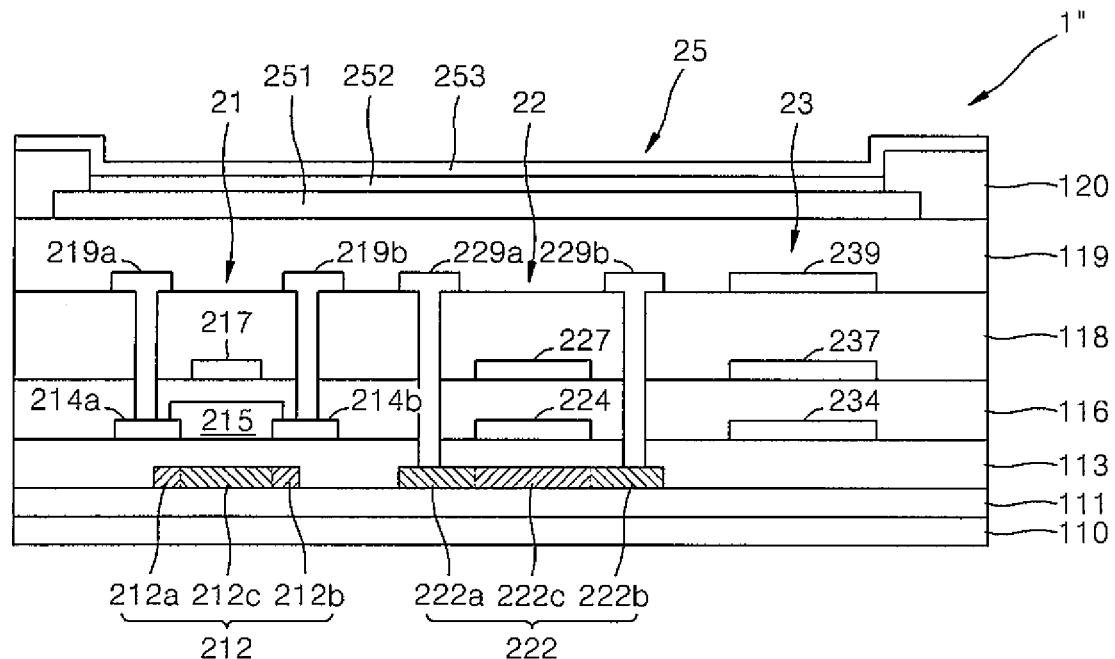
FIG. 7 is a cross-sectional view schematically illustrating an organic light-emitting display apparatus according to yet another embodiment of the present invention.

FIG. 7 is a cross-sectional view schematically illustrating an organic light-emitting display apparatus 1" according to another embodiment of the present invention.

The organic light-emitting display apparatus 1" shown in FIG. 7 is a top-emission type display apparatus. Reference numerals of elements of the organic light-emitting display apparatus 1" shown in FIG. 7 that are the same as reference numerals of elements of the display apparatuses shown in FIGS. 4 and 5 are like elements of the display apparatuses shown in FIGS. 4 and 5. In FIG. 7, the light-emitting device 25 is included in a top surface. Thus, an opening ratio or aperture may increase.

Thus far, the structure of the organic light-emitting display apparatus according to one or more embodiments of the present invention has been described. The organic light-emitting display apparatus according to one or more embodiments of the present invention has structural characteristics as follows.

First, as on-current increases by using a thin film transistor having a double gate structure including both the top gate electrode 217 and the bottom gate electrode 212, a size of the transistor may be reduced, and an opening ratio or aperture may be increased.

In addition, since overlaps of the top gate electrode 217, source electrode 219a, and drain electrode 219b are removed, and since overlapping areas of the source electrode 219a and the drain electrode 219b are removed by doping a partial area of the bottom gate electrode, an effect of parasitic capacitance may be removed. Therefore, a large-size high-resolution display may be operated by reducing parasitic capacitance in the thin film transistor.

In addition, since a channel length is reduced compared to a conventional oxide thin film transistor by forming the oxide semiconductor region 215, which serves as a channel, on (or in an area between) the source contact region 214a and the drain contact region 214b, on-current of the thin film transistor may be increased.

In addition, since thicknesses of the top gate electrode 217 and the third insulating layer 118 may be increased without influencing on-current of the thin film transistor, resistances and capacitances of a gate line and a data line may decrease. Thus, a large-size high-resolution display may be operated.

In addition, as the organic light-emitting display apparatus is manufactured by combining an oxide thin film transistor with excellent current leakage suppressing characteristics and a silicon thin film transistor with excellent electron mobility, pixels may be firmly designed. That is, the oxide thin film transistor may be used in a part where current leakage needs to be suppressed, and the silicon thin film transistor may be used in a part where a large on-current is needed. The first transistor 21 of one or more embodiments of the present invention may be applied to a part where current leakage suppressing characteristics and a large on-current are both needed.

Lastly, as thicknesses of the first insulating layer 113 and the second insulating layer 116 may be reduced, a capacitor having high capacity may be formed by including a first electrode 234 and a second electrode 237. In addition, a double capacitor may be formed by using the first electrode 234, the second electrode 237, and the third electrode 239. Thus, capacity of the capacitor may be increased.

As described above, according to the one or more of the above embodiments of the present invention, a thin film transistor (TFT) substrate, a display apparatus, and a method of manufacturing a TFT array substrate may decrease parasitic capacitance and increase on-current of TFTs.

It should be understood that the example embodiments described herein should be considered in a descriptive sense only and not for purposes of limitation. Descriptions of features or aspects within each embodiment should be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A thin film transistor array substrate comprising:
   a substrate;
   a bottom gate electrode comprising a gate area doped with ion impurities and undoped areas on left and right sides of the gate area;
   an active layer on the bottom gate electrode with a first insulating layer therebetween and comprising a source contact region, a drain contact region, and an oxide semiconductor region;
   a top gate electrode on the active layer with a second insulating layer therebetween; and
   a source electrode in contact with the source, contact regign and a drain electrode in contact with the drain contact region, the source electrode and the drain electrode being on the top gate electrode with a third insulating layer therebetween,
   wherein the oxide semiconductor region is between the source contact region and the drain contact region.

2. The thin film transistor array substrate of claim 1, wherein the gate area does not overlap the source contact region or the drain contact region.

3. The thin film transistor array substrate of claim 1, wherein the bottom gate electrode and the top gate electrode are connected to each other.

4. The thin film transistor array substrate of claim 1, wherein the bottom gate electrode comprises amorphous silicon or poly silicon.

5. The thin film transistor array substrate of claim 1, wherein a thickness of the first insulating layer or the second insulating layer is less than or equal to a thickness of the third insulating layer.

6. The thin film transistor array substrate of claim 1, wherein a thickness of the top gate electrode is greater than or equal to a thickness of the source contact region or the drain contact region.

7. The thin film transistor array substrate of claim 1, wherein a length of the oxide semiconductor region is less than or equal to a threshold value.

8. The thin film transistor array substrate of claim 1, wherein the oxide semiconductor region comprises at least one oxide selected from gallium indium zinc oxide (G-I—Z—O), zinc (Zn), indium (In), gallium (Ga), tin (Sn) cadmium (Cd), germanium (Ge), hafnium (Hf), or a combination thereof.

9. An organic light-emitting display apparatus comprising:
   a first transistor comprising a bottom gate electrode, a first active layer including a contact region and an oxide semiconductor region, a top gate electrode, a first source electrode, and a first drain electrode;
   a second transistor comprising a second active layer of a same layer and of a same material as the bottom gate electrode, a gate electrode of a same layer and of a same material as the contact region, and a second source electrode and a second drain electrode of a same layer and of a same material as the first source electrode and the first drain electrode; and
   a light-emitting device comprising a pixel electrode, an interlayer, and a counter electrode,
   wherein the oxide semiconductor region is between a source contact region and a drain contact region of the contact region, and
   wherein a region of the bottom gate electrode not overlapped by the source contact region or the drain contact region is doped with ion impurities.

10. The organic light-emitting display apparatus of claim 9, wherein the bottom gate electrode comprises:
   a gate area of a silicon semiconductor and doped with ion impurities; and
   undoped areas on left and right sides of the gate area.

11. The organic light-emitting display apparatus of claim 9, wherein the first transistor is a driving transistor of the organic light-emitting display apparatus, and the second transistor is a switching transistor of the organic light-emitting display apparatus.

12. The organic light-emitting display apparatus of claim 9, wherein the first source electrode and the first drain electrode do not overlap the doped region of the bottom gate electrode.

13. The organic light-emitting display apparatus of claim 9, further comprising a capacitor, wherein the capacitor comprises:
   a first electrode of the same layer and of the same material as the contact region; and
   a second electrode of .a same layer and of a same material as the top gate electrode.

14. The organic light-emitting display apparatus of claim 13, wherein the capacitor further comprises a third, electrode of the same layer and of the same material as the first source and first drain electrodes.

15. The organic light-emitting display apparatus of claim 9, wherein the bottom gate electrode comprises amorphous silicon or poly silicon.

16. The organic light-emitting display apparatus of claim 9, wherein the second transistor comprises an auxiliary gate electrode of a same layer and of a same material as the top gate electrode.

* * * * *